United States Patent
Chang

(10) Patent No.: US 11,057,027 B2
(45) Date of Patent: Jul. 6, 2021

(54) CIRCUIT HAVING A PLURALITY OF MODES

(71) Applicant: Realtek Semiconductor Corp., HsinChu (TW)

(72) Inventor: Szu-Yang Chang, Hsinchu (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 16/935,158

(22) Filed: Jul. 21, 2020

(65) Prior Publication Data

US 2021/0058079 A1 Feb. 25, 2021

(30) Foreign Application Priority Data

Aug. 22, 2019 (TW) .................. 108129943

(51) Int. Cl.
*H03K 5/15* (2006.01)
*H03K 5/135* (2006.01)
*H03L 7/07* (2006.01)
*H03K 5/156* (2006.01)
*H03K 5/00* (2006.01)

(52) U.S. Cl.
CPC ......... *H03K 5/15066* (2013.01); *H03K 5/135* (2013.01); *H03K 5/1565* (2013.01); *H03L 7/07* (2013.01); *H03K 2005/00013* (2013.01)

(58) Field of Classification Search
CPC .......... H03K 5/13; H03K 5/133; H03K 5/135; H03K 5/14; H03K 5/15; H03K 5/15006; H03K 5/15013; H03K 5/1506; H03K 5/15066; H03K 5/15076; H03K 5/156; H03K 5/1565; H03K 2005/00013; H03L 7/06; H03L 7/07; G01R 31/28; G01R 31/282; G01R 31/2852; G01R 31/2851; G01R 31/317

See application file for complete search history.

(56) References Cited

U.S. PATENT DOCUMENTS

| | | | |
|---|---|---|---|
| 5,646,545 A | 7/1997 | Trimberger | |
| 6,393,592 B1* | 5/2002 | Peeters | G01R 31/318541 714/727 |
| 7,777,534 B2* | 8/2010 | Kuan | H03K 5/1565 327/117 |
| 2004/0210807 A1* | 10/2004 | Sweet | G01R 31/318572 714/725 |

* cited by examiner

*Primary Examiner* — Diana J. Cheng
(74) *Attorney, Agent, or Firm* — Winston Hsu

(57) ABSTRACT

The present invention provides a circuit having a plurality of modes, wherein the circuit includes a first circuit, a second circuit, a first multiplexer, a second multiplexer and a specific flip-flop. In the operations of the circuit, the first circuit is configured to generate a first signal, the second circuit is configured to generate a second signal, the first multiplexer is configured to output one of the first signal and the second signal according to a mode selection signal, the second multiplexer is configured to output one of a first clock signal and a second clock signal according to the mode selection signal, and the specific flip-flop is configured to sample the first signal or the second signal outputted by the first multiplexer by using the first clock signal or the second clock signal outputted by the second multiplexer to generate an output signal.

10 Claims, 3 Drawing Sheets

CIRCUIT HAVING A PLURALITY OF MODES

BACKGROUND OF THE INVENTION

1. Field of the Invention

The present invention relates to circuit design, and more particularly, to a circuit that can meet setup time margin and hold time margin in different modes.

2. Description of the Prior Art

In a general circuit design, if a setup time margin is not enough, the conventional art usually delays a clock signal provided to the flip-flop to solve this problem. However, if the above-mentioned flip-flop is designed to operate in different modes at different time points, such as the test mode and the functional mode, since the signal path is not the same, it may be possible to solve the setup time margin issue in the functional mode, but will cause problems to the hole time margin in the test mode.

SUMMARY OF THE INVENTION

It is therefore an objective of the present invention to provide a circuit having a plurality modes, which can meet the setup time margin and the hold time margin in different modes, and only a few of delay circuits are required to be added to the circuit, to solve the above-mentioned problems.

According to one embodiment of the present invention, a circuit having a plurality of modes is disclosed, wherein the circuit comprises a first circuit, a second circuit, a first multiplexer, a second multiplexer and a specific flip-flop. In the operations of the circuit, the first circuit is configured to generate a first signal, the second circuit is configured to generate a second signal, the first multiplexer is configured to output one of the first signal and the second signal according to a mode selection signal, the second multiplexer is configured to output one of a first clock signal and a second clock signal according to the mode selection signal, and the specific flip-flop is configured to sample the first signal or the second signal outputted by the first multiplexer by using the first clock signal or the second clock signal outputted by the second multiplexer to generate an output signal.

According to another embodiment of the present invention, a signal processing method applied to a plurality of modes is disclosed, wherein the signal processing method comprises the steps of: using a first circuit to generate a first signal; using a second circuit to generate a second signal; outputting one of the first signal and the second signal according to a mode selection signal; outputting one of a first clock signal and a second clock signal according to the mode selection signal, wherein the first clock signal and the second clock signal have different phases; and using a specific flip-flop to sample the first signal or the second signal by using the first clock signal or the second clock signal to generate an output signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
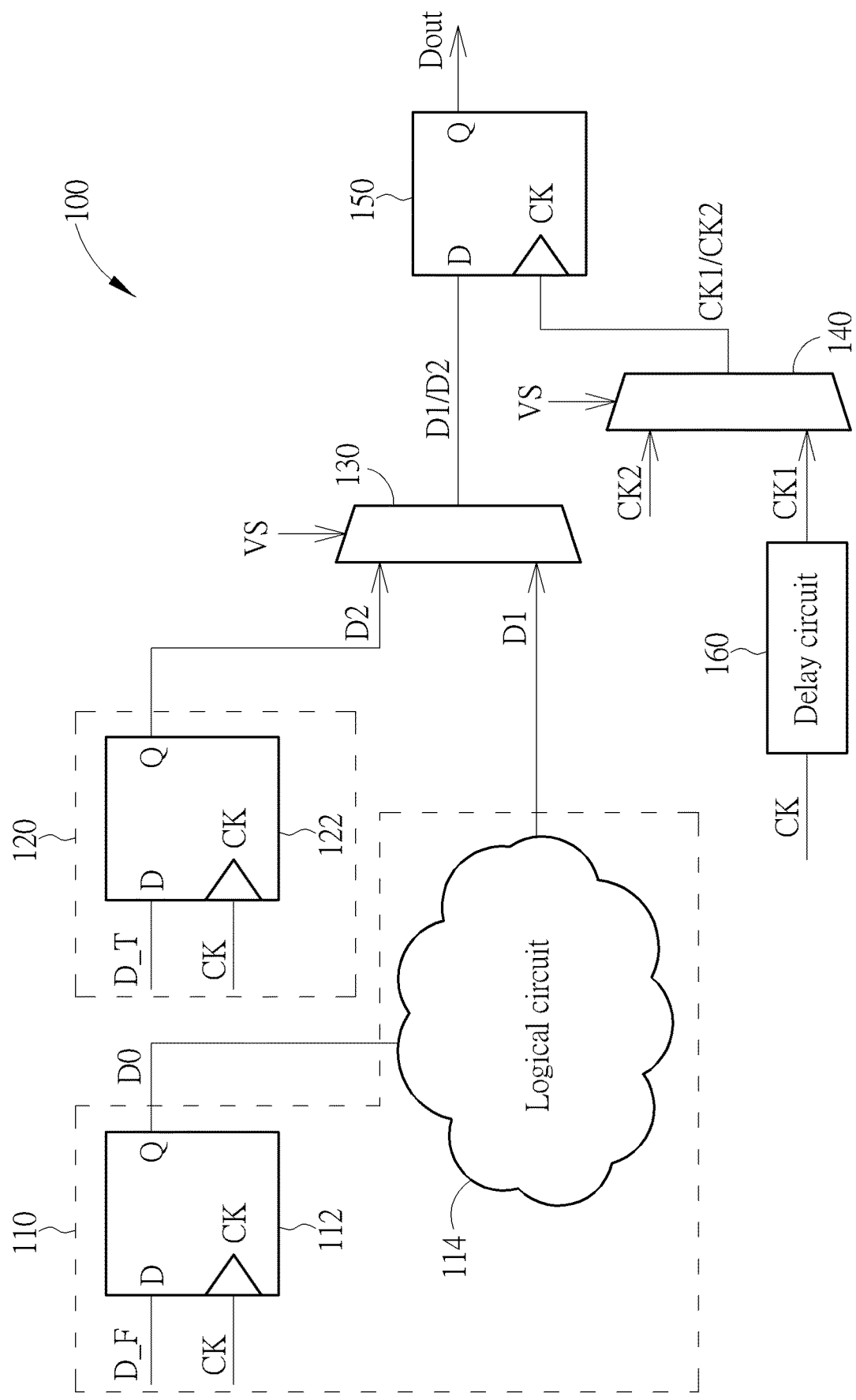
FIG. 1 is a circuit having a plurality of modes according to one embodiment of the present invention.

FIG. 1 is a diagram illustrating a circuit 100 having a plurality of modes according to one embodiment of the present invention. As shown in FIG. 1, the circuit 100 comprises a first circuit 110, a second circuit 120, a first multiplexer 130, a second multiplexer 140, a specific flip-flop 150 and a delay circuit 160. The first circuit 110 comprises a first flip-flop 112 and a logical circuit 114, and the second circuit 120 comprises a second flip-flop 122. In this embodiment, the circuit 100 is designed to meet the setup time margin and the hold time margin when operating either in a functional mode or a test mode.

Figure 2:
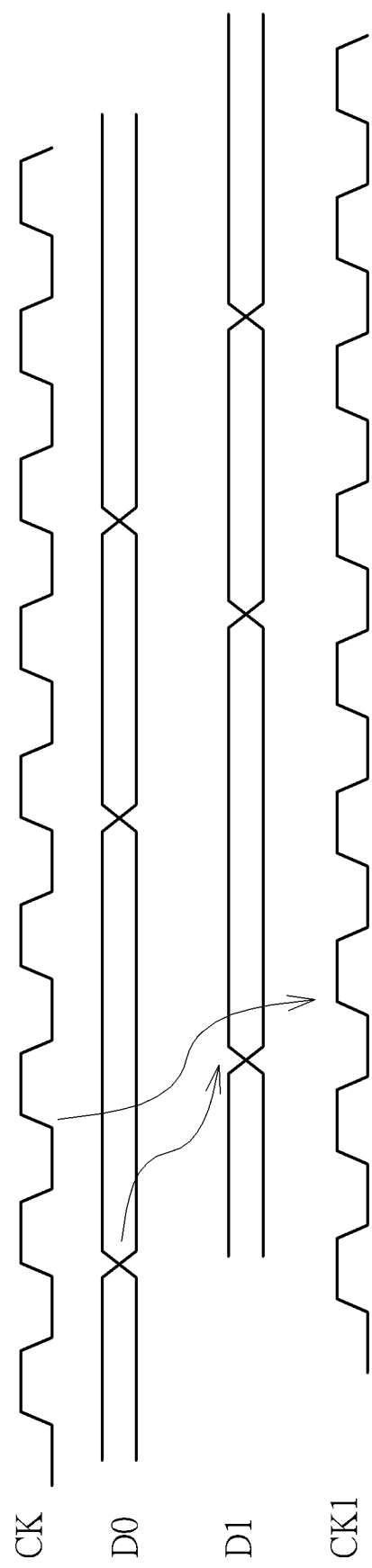
FIG. 2 shows a reference clock signal, a first signal and a first clock signal according to one embodiment of the present invention.

In the operations of the circuit 100, if the circuit 100 operates in the functional mode (e.g., the circuit 100 has been used in the electronic device and begins to function properly), other components within the circuit 100 will generate a mode selection signal VS to the first multiplexer 130 to select and output a first signal D1 generated by the first circuit 110. Referring to FIG. 1, the first flip-flop 112 uses a reference clock signal CK to sample a signal D_F, and the logical circuit 114 receives an output signal D0 of the first flip-flop 112 to generate the first signal D1. In this embodiment, the delay amount caused by the logical circuit 114 is close to or greater than a period of the reference clock signal CK, so the insufficient setup time margin issue may occur if the specific flip-flop 150 uses the reference clock signal CK to sample the first signal D1. Therefore, to solve this problem, the delay circuit 160 delays the reference clock signal CK to generate a first clock signal CK1, and the second multiplexer 140 refers to the mode selection signal VS to select and output the first clock signal CK1, for the specific flip-flop 150 using the first clock signal CK1 to sample the first signal D1 to generate an output signal Dout. FIG. 2 shows the reference clock signal CK, the output signal D0 of the first flip-flop 112, the first signal D1 and the first clock signal CK1. As shown in FIG. 2, because the first signal D1 is generated by the logical circuit 114 with greater delay amount, the specific flip-flop 150 samples the first signal D1 by using the first clock signal CK1 that has been delayed (i.e., phase-lag) can ensure the compliance of the setup time margin requirements.

If the circuit 100 operates in the test mode (e.g., the circuit 100 is under test in the factory and has not been applied to the electronic device), other components within the circuit 100 will generate the mode selection signal VS to the first multiplexer 130 to select and output a second signal D2 generated by the second circuit 120. In this embodiment, the second flip-flop 122 of the second circuit 120 uses the reference clock signal CK to sample a signal D_T to generate the second signal D2, and there is no delay circuit between the second flip-flop 112 and the first multiplexer 130. Therefore, because the first signal D1 generated by the first circuit 110 and the second signal D2 generated by the second circuit 120 have different path delays, the specific flip-flop 150 using the first clock signal CK1 (i.e., the delayed clock signal) to sample the second signal D2 may cause insufficient hold time margin. Therefore, the second multiplexer 140 refers to the mode selection signal VS to select and output the second clock signal CK2, for the specific flip-flop 150 using the second clock signal CK2 to sample the second signal D2 to generate the output signal Dout. In this embodiment, without a limitation of the present invention, the reference clock signal CK can serve as the second clock signal CK2. In other embodiments, as long as the phase of the first clock signal CK1 lags behind the phase of the second clock signal CK2, and the first clock signal CK1 and the second clock signal CK2 have the same frequency, the first clock signal CK1 and the second clock signal CK2 can be generated by using different methods.

In the embodiment shown in FIG. 1, there is no delay circuit between the second flip-flop 122 and the first multiplexer 130, but it's not a limitation of the present invention. In other embodiments, a delay circuit whose delay amount is less than the delay amount of the logical circuit 114 can be positioned between the second flip-flop 122 and the first multiplexer 130, that is the delay amount caused by the path between the second flip-flop 122 and the first multiplexer 130 is less than the delay amount of the logical circuit 114 or the delay amount of the delay circuit 160. It is noted that the above-mentioned delay circuit refers to circuit component such as buffer or inverter that is intentionally positioned in the circuit 100, and the wiring between two circuit components should not be considered as the delay circuit.

In light of above, when the specific flip-flop 150 receives the signal passing through a path with larger delay amount (e.g. the first signal D1), the specific flip-flop 150 will use the clock signal that is delayed by a larger delay amount (e.g. the first clock signal CK1) to sample the received signal, to meet the requirements of the setup time margin. In addition, when the specific flip-flop 150 receives the signal passing through a path with less delay amount (e.g. the second signal D2), the specific flip-flop 150 will use the clock signal that is delayed by a less delay amount (e.g. the second clock signal CK2) to sample the received signal, to meet the requirements of the hold time margin. Therefore, the circuit 100 can meet the setup time margin and the hold time margin in the different modes, and only the second multiplexer 140 and the delay circuit 160 having smaller chip area are required to be added to the circuit 100, to save the manufacturing cost.

Figure 3:
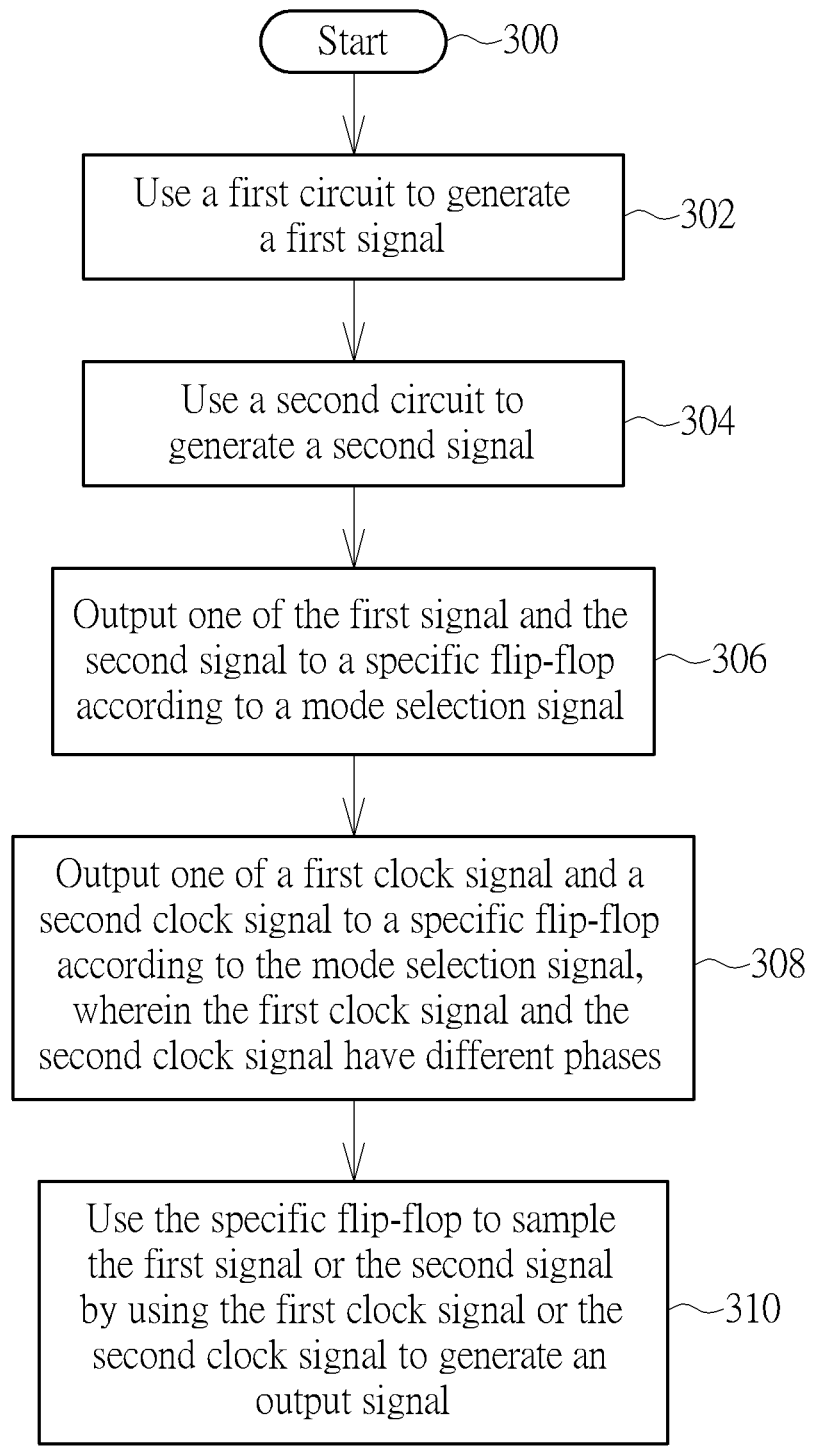
FIG. 3 is a flowchart of a signal processing method applied to a plurality of modes according to one embodiment of the present invention.

FIG. 3 is a flowchart of a signal processing method applied to a plurality of modes according to one embodiment of the present invention. Referring to the above embodiments, the flow of the signal processing method is described as follows.

Step 300: the flow starts.

Step 302: use a first circuit to generate a first signal.

Step 304: use a second circuit to generate a second signal.

Step 306: output one of the first signal and the second signal to a specific flip-flop according to a mode selection signal.

Step 308: output one of a first clock signal and a second clock signal to a specific flip-flop according to the mode selection signal, wherein the first clock signal and the second clock signal have different phases.

Step 310: use the specific flip-flop to sample the first signal or the second signal by using the first clock signal or the second clock signal to generate an output signal.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A circuit having a plurality of modes, comprising:
    a first circuit, arranged to generate a first signal;
    a second circuit, arranged to generate a second signal;
    a first multiplexer, coupled to the first circuit and the second circuit, arranged to output one of the first signal and the second signal according to a mode selection signal;
    a second multiplexer, arranged to output one of a first clock signal and a second clock signal according to the mode selection signal;
    a specific flip-flop, coupled to the first multiplexer and the second multiplexer, arranged to sample the first signal or the second signal outputted by the first multiplexer by using the first clock signal or the second clock signal outputted by the second multiplexer to generate an output signal of the specific flip-flop; and
    a delay circuit, arranged to delay the second clock signal to generate the first clock signal;
    wherein the first circuit comprises:
        a first flip-flop, arranged to generate an output signal of the first flip-flop according to the second clock signal; and
        a logical circuit, arranged to generate the first signal according to the output signal of the first flip-flop; and
    the second circuit comprises:
        a second flip-flip, arranged to generate the second signal according to the second clock signal.

2. The circuit of claim 1, wherein a phase of the first clock signal lags behind a phase of the second clock signal; and when the mode selection signal indicates a first mode, the first multiplexer outputs the first signal, and the second multiplexer outputs the first clock signal to the specific flip-flop; and when the mode selection signal indicates a second mode, the first multiplexer outputs the second signal, and the second multiplexer outputs the second clock signal to the specific flip-flop.

3. The circuit of claim 2, wherein the first mode is a functional mode, and the second mode is a test mode.

4. The circuit of claim 2, wherein the delay circuit is used to make the specific flip-flop be able to meet a setup time margin.

5. The circuit of claim 4, wherein delay amount of a path between the second flip-flop and the first multiplexer is less than delay amount of the delay circuit.

6. The circuit of claim 4, wherein there is no delay circuit between the second flip-flop and the first multiplexer.

7. A signal processing method applied to a plurality of modes, comprising:
    using a first circuit to generate a first signal;
    using a second circuit to generate a second signal; outputting one of the first signal and the second signal according to a mode selection signal;
    outputting one of a first clock signal and a second clock signal according to the mode selection signal, wherein the first clock signal and the second clock signal have different phases;
    using a specific flip-flop to sample the first signal or the second signal by using the first clock signal or the second clock signal to generate an output signal; and
    delay the second clock signal to generate the first clock signal;
    wherein the first circuit comprises:
        a first flip-flop, arranged to generate an output signal of the first flip-flop according to the second clock signal; and a logical circuit, arranged to generate the first signal according to the output signal of the first flip-flop; and the second circuit comprises:

a second flip-flip, arranged to generate the second signal according to the second clock signal.

8. The signal processing method of claim 7, wherein a phase of the first clock signal lags behind a phase of the second clock signal; and the step of using the specific flip-flop to sample the first signal or the second signal by using the first clock signal or the second clock signal to generate the output signal comprises:

when the mode selection signal indicates a first mode, using the specific flip-flop to sample the first signal by using the first clock signal to generate the output signal; and when the mode selection signal indicates a second mode, using the specific flip-flop to sample the second signal by using the second clock signal to generate the output signal.

9. The signal processing method of claim 8, wherein the first mode is a functional mode, and the second mode is a test mode.

10. The signal processing method of claim 8, wherein the delaying step is used to make the specific flip-flop be able to meet a setup time margin.

\* \* \* \* \*